Figure 1:
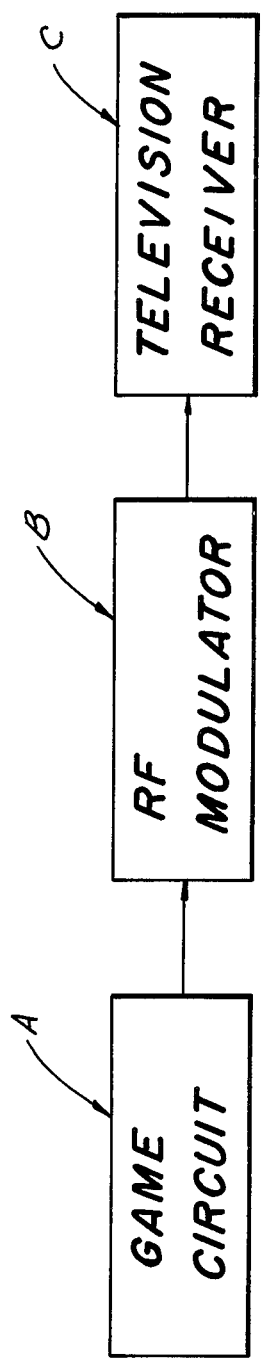

United States Patent [19]

Maine

[11] 4,160,959
[45] Jul. 10, 1979

[54] R.F. MODULATOR FOR USE IN T.V. GAMES

[75] Inventor: Stephen G. T. Maine, Ft. Salonga, N.Y.

[73] Assignee: General Instrument Corporation, Clifton, N.J.

[21] Appl. No.: 889,973

[22] Filed: Mar. 23, 1978

[51] Int. Cl.² ............................................. H03C 1/36
[52] U.S. Cl. ................................ 332/31 T; 325/182; 331/67; 331/109; 331/117 FE; 332/56
[58] Field of Search .................... 332/31 R, 31 T, 53, 332/59, 64, 56; 325/105, 182; 331/109, 182, 117 R, 67; 273/DIG. 28, 85 R; 340/324 AD

[56] References Cited

U.S. PATENT DOCUMENTS

| | | | |
|---|---|---|---|
| 3,271,680 | 9/1966 | Reynolds | 325/105 X |
| 3,436,681 | 4/1969 | Hart | 331/117 R |
| 4,034,990 | 7/1977 | Baer | 273/DIG. 28 X |

OTHER PUBLICATIONS

Electronics, "Voice Powers Transmitter," Mar. 1956.

*Primary Examiner*—Siegfried H. Grimm
*Attorney, Agent, or Firm*—James & Franklin

[57] ABSTRACT

An N-channel MOS monolythic R.F. Modulator for use in television games or the like is provided which internally generates an R.F. carrier signal and modulates same in accordance with the composite video output signal from the T.V. interface chip. The modulator utilizes two depletion mode MOSFETs connected in a cascode configuration, the output circuits of which are connected in series with an inductor, between a voltage source and ground. The input terminal of one of the transistors receives the composite video signal. The input terminal of the second transistor is connected to a resonant frequency circuit. The resonant frequency circuit is electromagnetically coupled to the inductor such that the current flowing through the inductor impresses a current in the resonant frequency circuit to cause same to generate the R.F. carrier signal. The magnitude of the video signal varies the conductance of the transistor output circuit thereby varying the current through the inductor and thus the amplitude of the carrier signal in the resonant frequency circuit. An output inductor is also electromagnetically coupled to the resonant frequency circuit to receive the amplitude modulated carrier signal therefrom in order to provide a low impedance output.

19 Claims, 2 Drawing Figures

R.F. MODULATOR FOR USE IN T.V. GAMES

The present invention relates to signal modulators and, more particularly, to an R.F. Modulator designed for use in a T.V. game.

Broadly considered, a signal modulator is an electrical component which varies one or more parameters of a first signal in accordance with a second signal. For example, the signal which is to be modulated could be a radio frequency (R.F.) signal of constant frequency and amplitude. The modulator could be used to vary the amplitude of this R.F. carrier signal in accordance with an input signal.

A conventional domestic television receiver is constructed to obtain the necessary video and audio information for reproduction thereof by processing an amplitude varying radio frequency carrier signal. Therefore, in order for a television receiver to function in conjunction with a T.V. game, it is necessary that the output of the T.V. game also be an amplitude modulated R.F. carrier signal, wherein the amplitude modulations define all of the information necessary to display the game. In a T.V. game, a composite video output signal is developed in accordance with the rules of the game and action of the players. To enable the television receiver to function in conjunction with the T.V. game, this composite video output signal must be converted into the type of signal which the television can process, that is, into an amplitude modulated R.F. carrier signal. This is accomplished by means of an R.F. modulator which varies the amplitude of an R.F. carrier signal in accordance with the composite video output generated by the T.V. interface chip of the T.V. game.

T.V. games, as they are currently being manufactured, comprise one or more integrated circuit chips, which generate the composite video signal and an R.F. modulator which, because it operates at frequencies normally considered to be beyond the capability of metal oxide semiconductor technology, is conventionally manufactured of discrete components. Such modulators are relatively expensive to manufacture when compared with the cost of the remainder of the game electronics and require a disproportionate space within the T.V. game.

The current highly competitive T.V. game market requires that T.V. games be manufactured as inexpensively as technology will permit. Because conventional R.F. modulators are made up of discrete components, the integrated circuit manufacturer who provides the chips for the T.V. normally cannot provide the modulator and the modulator must be purchased from a different source and thereafter interconnected with the integrated circuit chips when the game is assembled. The relatively high cost of the modulator itself and the labor required to connect same to the remainder of the T.V. game, have prevented significant cost reduction in the overall price of the T.V. game beyond a certain point.

It is, therefore, a prime object of the present invention to provide an R.F. modulator for use in a T.V. game which can be manufactured inexpensively and assembled with the remainder of the game such that the overall cost of the T.V. game is significantly reduced.

It is another object of the present invention to provide an R.F. Modulator for use in T.V. games wherein the modulator comprises transistors manufactured utilizing standard integrated circuit manufacturing techniques and a few discrete components.

It is a further object of the present invention to provide an R.F. Modulator for use in a T.V. game which can operate at television band I frequencies with suitable pass band characteristics, suitable signal level and adequate radiation characteristics.

It is still another object of the present invention to provide an R.F. Modulator for use in T.V. games wherein a radio frequency carrier signal is internally generated.

It is a still further object of the present invention to provide an R.F. Modulator for use in a T.V. game which has a low impedance output.

In accordance with the present invention, a modulator for use in a T.V. game is provided to modulate an R.F. carrier signal in accordance with an input signal, such as the composite video signal from the T.V. interface chip of a television game. The modulator includes a voltage source, gate means having an input terminal, operatively connected to receive the input signal, and an output circuit, as well as resonant frequency means operatively connected to the gate means to generate the carrier signal. Inductance means are operatively connected to the resonant frequency means. The output circuit of the gate means and the inductance means are operatively connected between the voltage source and ground. Further, output means, operatively connected to the resonant frequency means, are provided for connection with the television receiver antenna in order to transfer the amplitude modulated radio frequency carrier signal thereto.

The gate means comprises a dual gate transistor, preferably in the form of two depletion mode transistors connected in a cascode configuration. The gate means has two input terminals, one of which is connected to receive the input signal and the other of which is connected to the resonant frequency means.

The resonant frequency means comprises a capacitor and an inductor. The inductor is electromagnetically coupled to the inductance means. The output circuit of the gate means and the inductance means are connected in series between the voltage source and ground, such that the current through the inductor is regulated by the conductance of the gate means output circuit.

The output means preferably comprises an inductor which is also electromagnetically coupled to the resonant frequency means. A grounded R.F. screen is utilized to house the modulator components. Preferably, the output inductor is operatively connected to a circuit output which passes through the screen but is isolated therefrom. The output inductor is provided with a limited number of turns to provide a low impedance output.

Figure 2:
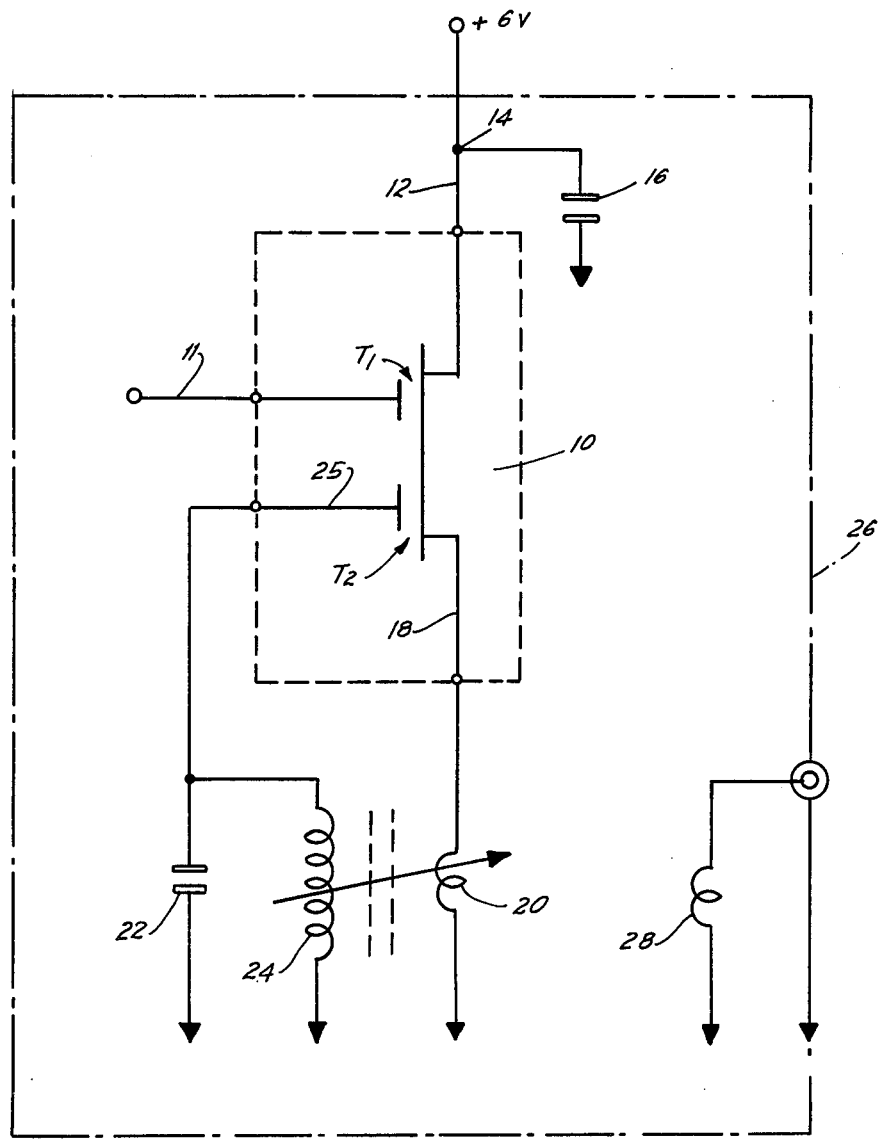

To the accomplishment of the above and to such other objects as may hereinafter appear, the present invention relates to an R.F. Modulator for a T.V. game, as described in the present specification and defined in the annexed claims, taken together with the accompanying drawings, wherein:

FIG. 1 is a block diagram showing the manner in which the R.F. modulator of the present invention is connected between the T.V. game signal source and the television receiver; and FIG. 2 is a schematic diagram of the R.F. modulator of the present invention.

FIG. 1 illustrates a T.V. game signal source, generally designated A, the output of which comprises a composite video signal generated by a T.V. game circuit of conventional design. The composite video signal output of the T.V. game circuit is connected to form the input signal for the R.F. modulator of the present invention, generally designated B. The output of the R.F. modulator is, in turn, connected to the antenna input of a conventional television receiver, generally designated C.

As shown in FIG. 2, the R.F. Modulator of the present invention comprises two MOS transistors, T1 and T2, formed on a single integrated circuit chip 10. Transistors T1 and T2 are depletion mode N-channel MOSFETs which are connected in a cascode configuration to form a dual gate field effect transistor. The input terminal 11 of transistor T1 is connected to receive the input signal, for example, the composite video signal output of the T.V. interface chip of a T.V. game. The drain terminal 12 of transistor T1 is connected to a voltage source, typically +6 volts, through a node 14 to which a R.F. bypass capacitor 16 is connected.

The source terminal 18 of transistor T2 is connected to ground through an inductor 20. The resonant frequency circuit, comprising a capacitor 22 and an inductor 24, is connected to the input terminal 25 of transistor T2. Inductors 20 and 24 are electromagnetically coupled in transformer fashion.

The modulator is located within an R.F. screen 26. An output inductor 28, which is also electromagnetically coupled to the resonant frequency circuit, is connected to the circuit output which passes through a grounded R.F. screen 26.

Since transistors T1 and T2 are both depletion mode transistors, a current will flow through the output circuit of the transistors and thus inductor 20, from the voltage source to ground, even when the gate 11 of transistor T1 has no video signal applied thereon. It should be noted that input terminal 25 is held at 0 volts DC because it is connected to ground via inductor 24. Under this condition, the intermediate drain-source junction between transistors T1 and T2 will act as a drain and saturate at a given voltage level. Thus, even when no video signal is applied to gate 11, a D.C. current will flow through the output circuit of transistors T1 and T2 and through inductor 20 to ground. The magnitude of this D.C. current will be a function of the combined resistance of the output circuits of transistors T1 and T2.

As the current flowing through inductor 20 varies a current is impressed on inductor 24, by means of the electromagnetic coupling therebetween. Obviously, the amount of current which is impressed in inductor 24 will depend upon the efficiency of the electromagnetic couple and thus, the number of turns in each of the inductors and the spacing therebetween. The efficiency of the coupling between inductors 20 and 24 can be varied as required by the circuit. However, a 5:1 turn ratio has been found to function satisfactorily.

The impressed current in inductor 24 will cause the resonant frequency circuit, comprised of capacitor 22 and inductor 24, to oscillate in a manner determined by the characteristics of transistor T2. The current impressed on inductor 24 will flow in a direction which is opposite to the direction of current flow in inductor 20. Since the coupling between the inductors is fixed, the magnitude of the impressed current in inductor 24 is a function of the magnitude of the current in inductor 20. The impressed current in inductor 24 flows to and is stored in capacitor 22 until the voltage at input terminal 25 of transistor T2 reaches the cut-off voltage. At cut-off, the resistivity of the output circuit is high, thus preventing current flow through the transistor output circuit and causing the current through inductor 20 to cease. The current stored in capacitor 22 will then flow back to inductor 24 and transistor T2 will again turn on permitting current to flow through inductor 20 again. The current flow through inductor 20 once again impresses a current on inductor 24. This positive feedback approach maintains the oscillations in the resonant frequency circuit by imparting energy thereto to make up for circuit losses.

The frequency of the oscillations will be determined by the capacitance of capacitor 22 and the inductance of inductor 24, as in any resonant frequency circuit. However, the amplitude of the oscillating signal is determined by the magnitude of the current through inductor 20, which in turn is a function of the resistance of the transistor output circuit. This latter value is dependant upon the voltage applied to input terminal 11 and the characteristics of transistor T2, that is, its cut-off voltage.

Since the characteristics of transistor T2 are set, when an input voltage is applied to the gate 11 of transistor T1, the amplitude of the oscillation will vary in accordance therewith. For instance, if the voltage at the gate 11 of transistor T1 decreases, the resistivity of the output circuit will increase. This will cause the current flowing through inductor 20 to decrease and the amplitude of the oscillation will decrease in direct proportion. Thus, the peak available output current will be directly proportionable to the voltage applied to the input terminal 11 of transistor T1 and the peak to peak voltage will be proportional to the voltage on the input terminal 11 of transistor T1 with transistor T2 controlling the zero crossing point of the sine wave output. It can therefore be seen that the output current in a function of the voltage at the input terminal 11 of transistor T1 and the voltage at the input terminal 25 of transistor T2. The resulting device, therefore, forms a product mixer with excellant linearity.

The current which flows through the resonant frequency circuit, caused by the oscillations occuring therein, creates an electromagnetic radiation pattern which can be sensed with output inductor 28. The placement, therefore, of output inductor 28 (and the number of turns thereof) defines the resulting signal amplitude in the output signal. Thus, the amplitude of the resulting output signal can be varied simply by changing the position of the output inductor 20 or the number of turns therein. However, since a low impedance output is desired, it is preferable to have inductor 28 with the minimum number of turns. Alternatively, the output node could be connected directly to the resonant frequency circuit through a resistor, in order to provide the necessary output.

It should be appreciated that the impressed current on inductor 24 makes up for the energy losses in the resonant frequency circuit. It is therefore advisable to include a resistor in the resonant frequency circuit to maintain the Q thereof at a constant value to provide for a fixed energy loss. Further, in order to stabilize circuits such as this against variations in output due to differences in the parameters of the MOSFET's (i.e., the cut off voltage) from circuit to circuit due to production techniques, an additional resistor may be placed in series with the transistor output circuit. Alternatively, a D.C. voltage of a given magnitude can be applied to the gate of transistor T2 to assure that the cut-off voltage of transistor T2 will be the same for each circuit fabricated.

Due to the linear characteristics of the N-channel MOSFET, the cross modulation and harmonic mixes are low and therefore, the need for a band pass output filter is eliminated. This is a further advantage of the present invention.

As will now be readily appreciated, the present invention relates to an R.F. Modulator for use in a T.V. game which can be constructed in a relatively inexpensive manner by conventional integrated circuit manufacturing techniques and the use of a limited number of discrete components. The circuit configuration permits the use of MOS technology at frequencies for which same is normally considered to be inappropriate. The invention permits the R.F. Modulator to be manufactured as one of the integrated circuit chips of the T.V. game, eliminating the requirement for the separate manufacture and connection of a conventional modulator and thus, reducing the overall cost of the T.V. game substantially.

While only a single embodiment of the present invention has been disclosed herein for purposes of illustration, it is obvious that many variations and modifications could be made thereto. It is intended to cover all of these modifications and variations which fall in the scope of the present invention, as defined by the following claims.

I claim:

1. Apparatus for modulating a signal in accordance with an input signal, said apparatus comprising: a voltage source; dual gate means having first and second input terminals and an output circuit, said first input terminal being operatively connected to receive the input signal; resonant frequency means, operatively connected to said second input terminal, for generating the signal to be modulated; inductance means operatively inductively coupled to said resonant frequency means; said output circuit and said inductance means being operatively connected between said source and ground; and an output means operatively connected to said resonant frequency means.

2. The apparatus of claim 1, wherein said dual gate means comprises a dual gate transistor.

3. The apparatus of claim 2 wherein said transistor is a depletion mode transistor.

4. The apparatus of claim 1 wherein said gate means comprises two depletion mode transistors connected in a cascode configuration.

5. The apparatus of claim 1 wherein said resonant frequency circuit comprises an inductor, said inductor being electromagnetically coupled to said inductance means.

6. The apparatus of claim 1 wherein said output circuit and said inductance means are connected in series.

7. The apparatus of claim 1 wherein said output means comprises an inductor and wherein said inductor is electromagnetically coupled to said resonant frequency means.

8. The apparatus of claim 1, wherein the input signal comprises the output of a T.V. game circuit.

9. The apparatus of claim 8, wherein said T.V. game circuit output comprises a composite video signal.

10. The apparatus of claim 1, further comprising a T.V. game circuit and wherein the input signal is the composite video signal output of said T.V. game circuit.

11. The apparatus of claim 1, wherein said output means is adapted to be operatively connected to the input of a television receiver.

12. The apparatus of claim 1, further comprising a T.V. receiver and wherein said output means is operatively connected to the input of said T.V. receiver.

13. The apparatus of claim 8, wherein said output means is adapted to be operatively connected to the input of a television receiver.

14. The apparatus of claim 10, further comprising a T.V. receiver and wherein said output means is operatively connected to the input of said T.V. receiver.

15. Apparatus for generating a carrier signal and for modulating same in accordance with an input signal, said apparatus comprising: a voltage source, first and second depletion mode transistors connected in cascode configuration to form an output circuit, each of said transistors having an input terminal, the input terminal of one of said transistors being connected to receive said input signal; an LC circuit comprising a first inductor, said LC circuit being connected to the input terminal of said second transistor; a second inductor electromagnetically coupled to said first inductor; said output circuit being connected in series with said second inductor between said source and ground, and output means operatively connected to said LC circuit.

16. The apparatus of claim 15 wherein said output means comprises an inductor and wherein said inductor is electromagnetically coupled to said LC circuit.

17. Apparatus for modulating a parameter of a signal in accordance with an input signal comprising a voltage source, an inductor connected to said source, dual gate means having first and second input terminals, said gate means being interposed between said inductor and said source, said first input terminal being operatively connected to receive the input signal, said gate means regulating the magnitude of the current flow through said inductor in accordance therewith, means operatively connected to said second input terminal and inductively coupled to said inductor for generating a signal having a parameter dependent upon the magnitude of the current through said inductor, and output means operatively connected to said signal generating means.

18. The apparatus of claim 17, wherein said input signal is externally generated.

19. The apparatus of claim 17, further comprising a T.V. game circuit and wherein the output of said T.V. game circuit comprises said input signal.

* * * * *